United States Patent [19]

Ikeda et al.

[11] 4,312,692
[45] Jan. 26, 1982

[54] METHOD OF MOUNTING ELECTRONIC COMPONENTS

[75] Inventors: Junji Ikeda, Ikoma; Ryuzo Hochin, Kadoma; Tamotsu Wakahata, Katano, all of Japan

[73] Assignee: Matsushita Electric Industrial Co., Ltd., Kadoma, Japan

[21] Appl. No.: 127,392

[22] Filed: Mar. 5, 1980

[30] Foreign Application Priority Data

Mar. 9, 1979 [JP] Japan .................. 54-28101

[51] Int. Cl.³ .................................. B29C 27/04
[52] U.S. Cl. .................. 156/272; 29/831; 29/832; 29/834; 156/327; 156/330; 156/332; 428/901
[58] Field of Search .......... 156/272, 327, 330, 332; 428/901; 29/831, 832, 834

[56] References Cited

U.S. PATENT DOCUMENTS 2,983,853  5/1961  Williams .................. 29/832
4,222,635  9/1980  Jülke ...................... 156/272

FOREIGN PATENT DOCUMENTS 5183166  7/1976  Japan .................... 156/272

Primary Examiner—Caleb Weston
Attorney, Agent, or Firm—Whittemore, Hulbert & Belknap

[57] ABSTRACT

A method of mounting electronic components on a printed circuit board by temporarily attaching the electronic component (4) to the circuit board (1) with adhesive (3) applied to the board (1), irradiating the adhesive (3) with ultraviolet rays with or without heating to cure the adhesive (3) and thereby rigidly attach the component (4) to the board (1), and thereafter joining the electrodes (5) of the component (4) to conductor portions (2) on the board (1). Excess adhesive portions (3a) adjoining the component (4) are cured first to subsequently cure the other portion of the adhesive (3) in chain relation to the curing of the excess.

8 Claims, 8 Drawing Figures

METHOD OF MOUNTING ELECTRONIC COMPONENTS

The present invention relates to a method of mounting electronic components, and more particularly to a method of mounting electronic components on a printed circuit board by attaching the components to the circuit board with adhesive and thereafter eventually joining the electrode portions of the components to conductors on the board by soldering to form an electric circuit.

Electronic components, such as chip resistors and chip capacitors, are attached to printed circuit boards of phenol, epoxy, polyimide or like resin usually by applying a small amount of adhesive to the component or to a blank portion of the soldering pattern on the board, placing the component on the board, then passing the assembly through a heating furnace to cure the adhesive and provide a joint resistant to the force and heat to be applied thereto during soldering, and thereafter dipping the assembly in a molten solder bath for soldering.

It is also known to attach electronic components to a printed circuit board by applying pasty solder to the pattern bearing side of the board, placing the component on the board in contact with the solder, heating the assembly to a high temperature, and allowing the assembly to stand for spontaneous solidification of the solder.

The former method involves problems in the heat resistance and strength of the joint during soldering and is of very low productivity because the adhesive requires a prolonged period of time for complete curing.

Although the latter method is advantageous in that the component can be attached rapidly without the necessity of using adhesive for holding the component in place before soldering, the component is liable to move while the pasty solder is in a molten state and is not mountable in place with accuracy. Since the component is easily movable during soldering, it is difficult to form a uniform solder layer. A thin layer will not have sufficient joint strength, whereas a thick layer involves the likelihood of causing short-circuiting between adjacent conductor portions.

The main object of the present invention is to overcome the above drawbacks and to provide a novel method of mounting electronic components on printed circuit boards. The method is characterized by attaching electronic components to a printed circuit board efficiently with adhesive and thereafter joining them together effectively by soldering. The components are temporarily held to the board with the adhesive and subsequently regularly attached thereto by curing the adhesive with ultraviolet rays.

With the method of this invention, the electronic components are held in a fixed position during soldering and are mountable in position with high accuracy. Additionally the components can be attached to the board very efficiently since the adhesive is curable with ultraviolet rays, without being thermally affected by heating that would impair the performance of the components. The board having the components attached thereto can be dipped in a solder bath as in the prior art, whereby a circuit can be fabricated with high reliability and accuracy.

When desired, the adhesive can be heated conjointly with ultraviolet irradiation, in which case heating can be effected at a lower temperature without entailing thermal degradation of the electronic components.

According to a preferred mode of practicing the present method, the adhesive applied between the component and the board has an excess portion which can be exposed to rays (and heat), such that the adhesive is cured first at this portion and thereafter at the remaining portion progressively in a chain-like fashion. Whereas the portion of the adhesive which is positioned between the component and the board and which will not be exposed directly to rays or light would otherwise take a longer period of time for curing, this method assures rapid curing of the adhesive, consequently making it possible to reduce the number of steps required for the overall process.

The preferred embodiment of the invention will be described below in detail with reference to the accompanying drawings, in which.

Figure 1:
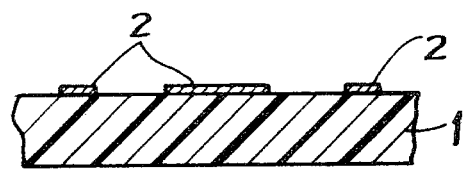
FIG. 1 to FIG. 4 are sectional views showing the step of mounting electronic components on a printed circuit board according to the method of this invention.
Figure 2:
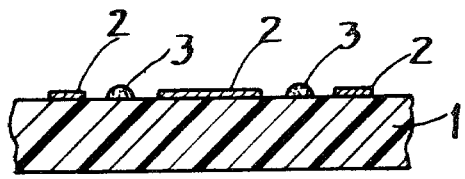
Figure 3:
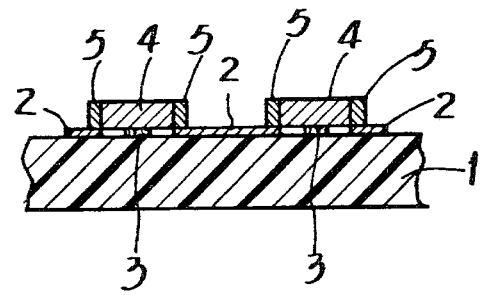
Figure 5:
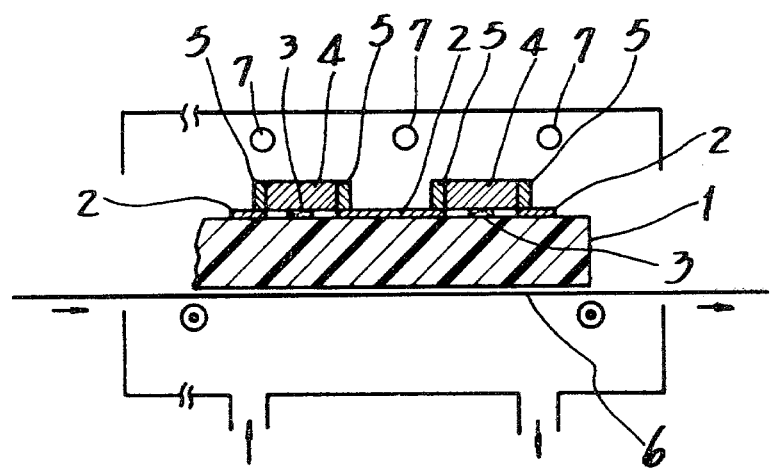
FIG. 5 is a diagram showing an apparatus for curing adhesive.
Figure 6:
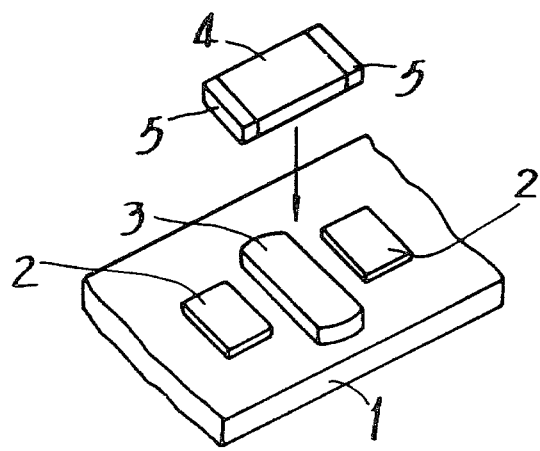
FIG. 6 is a perspective view showing how the electronic component is attached to the board.
Figure 7:
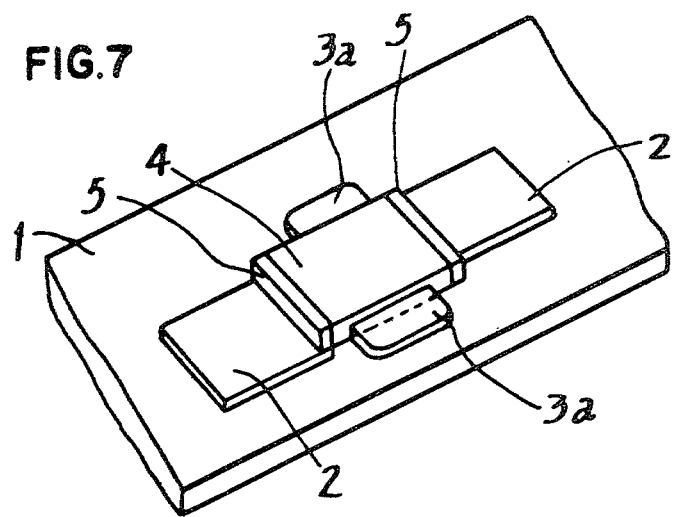
FIGS. 7 and 8 are a perspective view and a sectional view, respectively, showing the component placed on a layer of adhesive on the board with excess portions of adhesive adjoining the component.
Figure 8:
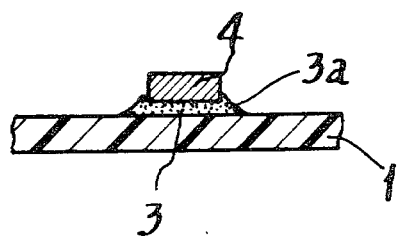

FIG. 1 is a sectional view showing a printed circuit board 1 useful in this invention. Conductor portions 2 made of copper foil provide on the board 1 a pattern for electric wiring. According to the invention, adhesive 3 is applied to predetermined portions of the board 1 between the copper foil conductor portions 2 and 2 as seen in FIG. 2. The adhesive is applied by screen printing, stamping with an applicator, coating with a dispenser or like method. Subsequently electronic components 4 having silver, palladium or like electrodes 5 are placed on the adhesive portions on the board 1 with the electrodes 5 in contact with the conductor portions 2. Thus the components 4 are temporarily attached to the board 1 by the tackiness of the adhesive 3 as shown in FIG. 3. The component 4 thus installed in place is best shown in FIGS. 7 and 8, in which it is seen that the adhesive on the board 1 is forced out beyond the side edges of the component 4 to provide excess portions 3a. The component 4 can be attached to the board with the adhesive more effectively when the excess portions 3a are so formed that the side faces of the component 4 are partly in contact with the excess portions 3a. The board 1 having the components 4 thus temporarily attached thereto by the tackiness of the adhesive 3 is then transported on a conveyor 6 as shown in FIG. 5. During transport on the conveyor 6, the board 1 is irradiated from above the components 4 with ultraviolet rays by an ultraviolet lamp 7, whereby the adhesive 3 is cured to effectively attach the components 4 in position. Thus the components 4 are rigidly attached to the board 1.

The above process will be described in greater detail. First, to temporarily attach the component to the board, a substantial amount of adhesive is applied to the board so that the adhesive adheres also to part of the side faces of the component. This can be done by forming a thick layer of adhesive over the same width as the component and pressing the component against the adhesive layer to partly force out the adhesive, or by forming an adhesive layer of larger width than the component before the installation of the component. When the board is irradiated with ultraviolet rays for curing, the reaction is initiated first at the excess portions 3a which are exposed to the rays and is thereafter effected progressively toward the remaining portion beneath the component in a chain-like manner, whereby the adhesive can be wholly cured.

Figure 4:
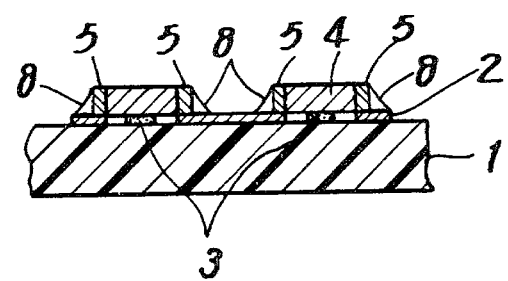

The resulting assembly is thereafter dipped in a usual molten solder bath to join the electrodes 5 of the components 4 to the conductor portions 2 on the board 1 with solder 8 as seen in FIG. 4.

The printed circuit board 1 is made of an insulating material, such as polyimide film, epoxy film having glass cloth incorporated therein, polyester film or laminated phenol sheet. The adhesive 3 comprises a material which is curable by ultraviolet irradiation. An example of useful adhesive compositions comprises an unsaturated polyester resin as the main component, benzoin butyl ether or the like as a sensitizer and trialkyl or triallyl phosphite or the like as a stabilizer. Another useful example comprises a monomer, oligomer or polymer serving as the main component and prepared by reacting an epoxy compound with acrylic or methacrylic acid in the presence of a tertiary amine, and a sensitizer such as benzoin or benzophenone compound. Another example is a composition comprising an addition product of olefin and thiol serving as the main component and benzophenone, fluorenone or like carbonyl compound serving as a sensitizer. Another example is a composition comprising bisphenol A-diglycidyl ether, aliphatic ether epoxide or like epoxy resin, and an allyldiazonium salt of complex halide which forms a Lewis acid when subjected to photodecomposition. The adhesives useful in this invention are highly reactive, such that when the excess adhesive portion 3a adjoining the side edge of the component 4 is irradiated with ultraviolet rays from above the board 1, the portion starts to undergo curing reaction, which subsequently proceeds over the remaining portion of the adhesive in a chain-like fashion to wholly cure the adhesive. The conditions under which the board is irradiated with ultravoilet rays are dependent on the ultraviolet activity and curing properties of the adhesive. With the present embodiment, the assembly was irradiated with ultraviolet rays at an intensity of 80 w/cm over a width of 150 mm while being transported at a speed of 3 m/min. The time required for completely curing the adhesive was as short as 3 seconds, whereas the conventional heating method takes 10 minutes for completely attaching the component in place. Thus the present method achieved a remarkably improved work efficiency. According to the invention, therefore, the component attaching step can be incorporated into a mass-production process without necessitating a very large heating furnace or like apparatus conventionally used.

Although the present invention has been described above as embodied for chip components, the invention can be practiced in the same manner as above for discrete components having lead wires. While the adhesive is applied to the board before the installation of electronic components according to the above embodiment, the components are similarly mountable on the board by applying the adhesive to the bottom of the component, then setting the component on the board and pressing the component against the board to fit the component intimately to the board with the adhesive provided therebetween. It is also possible to use an adhesive containing an ultraviolet sensitizer conjointly with a thermally active catalyst so as to afford improved productivity and enhanced bond strength with both ultraviolet rays and heat. Useful thermally active catalysts include organic peroxides, azo compounds, etc.

The adhesive can be cured by ultraviolet irradiation or by both such irradiation and heating. In the latter case, the assembly can be heated, for example, simultaneously with or after ultraviolet irradiation, or in some other manner.

What is claimed is:

1. A method of mounting electronic components on a printed circuit board comprising the steps of temporarily attaching the electronic component to the circuit board with an adhesive, curing the adhesive by irradiating the adhesive with ultraviolet rays to rigidly attach the component to the board and soldering the resulting assembly, wherein when the component is held temporarily attached to the board, the adhesive has an excess portion extending outward from between the component and the board, and the excess portion of the adhesive is initially cured to thereafter cure the other portion of the adhesive in chain relation to the curing of the excess portion and thereby rigidly attach the component to the board.

2. A method as defined in claim 1 wherein the adhesive is cured by both ultraviolet irradiation and heating.

3. A method as defined in claim 1 or 2 wherein an amount of the adhesive is applied to the board before attaching the component thereto so that the adhesive adheres to part of a side face of the component under the pressure applied for temporarily attaching the component to the board.

4. A method as defined in claim 2 wherein the adhesive contains an ultraviolet sensitizer and a thermally active catalyst as curing catalysts.

5. A method as defined in claim 1 wherein the excess portion is formed by applying an amount of the adhesive to the board before attaching the component thereto so that the adhesive is partially forced out from between the component and the board when the component is pressed against the board.

6. A method as defined in claim 1 wherein the excess portion is formed by applying the adhesive to the board over a width larger than the width of the component before attaching the component to the board.

7. A method as defined in claim 1 or 2 wherein the adhesive comprises an acrylic resin, unsaturated polyester resin, thiol-olefin resin or epoxy resin.

8. A method as defined in claim 1 wherein the adhesive has incorporated therein an ultraviolet sensitizer as a curing catalyst.

* * * * *